United States Patent
Alger et al.

(10) Patent No.: US 6,916,183 B2
(45) Date of Patent: Jul. 12, 2005

(54) ARRAY SOCKET WITH A DEDICATED POWER/GROUND CONDUCTOR BUS

(75) Inventors: William O. Alger, Portland, OR (US); Gary B. Long, Aloha, OR (US); Gary A. Brist, Yamhill, OR (US); Carlos Mejia, Portland, OR (US)

(73) Assignee: Intel Corporation, Santa Clara, CA (US)

(*) Notice: Subject to any disclaimer, the term of this patent is extended or adjusted under 35 U.S.C. 154(b) by 6 days.

(21) Appl. No.: 10/379,844

(22) Filed: Mar. 4, 2003

(65) Prior Publication Data

US 2004/0175966 A1 Sep. 9, 2004

(51) Int. Cl.[7] ............................................. H01R 12/00
(52) U.S. Cl. ....................................................... 439/69
(58) Field of Search .......................... 439/68–73, 721, 439/723, 949, 342, 525, 526

(56) References Cited

U.S. PATENT DOCUMENTS

| | | | | |
|---|---|---|---|---|
| 5,683,256 A | * | 11/1997 | Werther | 439/69 |
| 5,919,259 A | * | 7/1999 | Dahl | 713/300 |
| 5,982,635 A | * | 11/1999 | Menzies et al. | 361/790 |
| 6,176,709 B1 | * | 1/2001 | Sonobe et al. | 439/69 |
| 6,347,946 B1 | * | 2/2002 | Trobough et al. | 439/70 |
| 6,551,112 B1 | * | 4/2003 | Li et al. | 439/66 |
| 6,558,181 B2 | * | 5/2003 | Chung et al. | 439/342 |

* cited by examiner

Primary Examiner—Ross Gushi
(74) Attorney, Agent, or Firm—Blakely, Sokoloff, Taylor & Zafman LLP

(57) ABSTRACT

An apparatus for receiving a microchip and having a conductor buses therein. A top surface of the apparatus receives the microchip while the bottom surface is to mount to a circuit board. A plurality of pin receptacles pass through the top surface to receive a corresponding plurality of microchip pins of the microchip. The conductor bus resides at least in part between the top surface and the bottom surface and is electrically coupled to a first plurality of the plurality of the pin receptacles.

30 Claims, 8 Drawing Sheets

ARRAY SOCKET WITH A DEDICATED POWER/GROUND CONDUCTOR BUS

TECHNICAL FIELD

This disclosure relates generally to array sockets for coupling to microchips and in particular but not exclusively, relates to providing a dedicated power/ground conductor bus within the array socket.

BACKGROUND INFORMATION

Array sockets are widely used to seat a microchip on a circuit board so that the microchip may be replaced or upgraded to improve performance at a later date. Typical microchips include, but are not limited to, memory modules, microprocessors, and BIOS chips.

FIG. 1 is a cross-sectional view of an exemplary array socket system 100 including a microchip 120 having microchip pins 125 seated in corresponding pin receptacles (not shown) of an array socket 110. Array socket 110 includes a plurality of socket pins 145 that are electrically coupled within array socket 110 to the corresponding pin receptacles. Socket pins 145 are electrically connected to conductor traces 230 (FIG. 2) such that signals and/or power may be delivered to/from microchip 120 from other components on circuit board 140.

FIG. 2 is a view of a bottom side of circuit board 140 illustrating a plurality of pads 210, which electrically couple to corresponding socket pins 145. Conductor traces 230 form electrical contact with corresponding pads 210 and run outwards from pads 210 to various other electronic components mounted on or coupled to circuit board 140. Conductor traces 230 making contact with inner pads 210 must run between outer pads 210. As can be seen from FIG. 2, routing conductor traces 230 away from pads 210 can consume a large area on circuit board 140. As the number of microchip pins 120 increases, the number of pads 210 and conductor traces 230 increases. Thus, in complex microchips, finding a workable routing scheme becomes a complex task.

Furthermore, as microchips become faster, more powerful, and generally speaking more complicated, they demand increasing amounts of power and I/O paths. One solution has been to increase the number of microchip pins 120 to service the increasing number of I/O paths. Generally speaking, as the number of microchip pins 125 increases, the package I/O pitch P (FIGS. 3 and 4) between neighboring microchip pins 125 has continued to shrink to accommodate the added microchip pins 120 and corresponding conductor traces 230.

FIG. 3 illustrates a cross-sectional view taken at line A–A' in FIG. 2, and FIG. 4 is an expanded view of an area B in FIG. 2. Vias 310 are created in circuit board 140 to allow socket pins 145 to pass through to the under side of circuit board 140. In a four-layer circuit board, there typically is a ground conductor layer 320A and a power conductor layer 320B. When via 310 is created in circuit board 140, an anti-pad 410 is created by etching back the copper of ground conductor layer 320A and power conductor layer 320B. Anti-pad 410 ensures that a short circuit does not occur between pad 210 and either one of ground conductor layer 320A or power conductor layer 320B. Consequently, conductor traces 230 are limited in width W by the distance between neighboring anti-pads 410.

Thus, as the trend continues towards tighter package I/O pitches P, width W of conductor traces 230 servicing pads 210 must also shrink. Currently, width W is 1.27 mm, but designs are in the works for package I/O pitches P ranging from 1 mm to as low as 0.4 mm. A step down to a package I/O pitch P of 1 mm results in a loss of approximately 21% in width W. As width W decreases the copper to delivery power to microchip 120 decreases. Reduced width W of conductor traces 230 results in a higher linear resistance and increased power loss and heat dissipation in conductor traces 230. The current trend of tighter I/O package pitches P is cornering chip designers into a two-fold problem-reduced power delivery capacity and increased power supply demand.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a method and apparatus for implementing an array socket having a conductor bus are described herein. In the following description numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. "Microchip" is defined to mean any integrated circuit device having more than one input/output ("I/O") port (e.g., pin).

Figure 5:
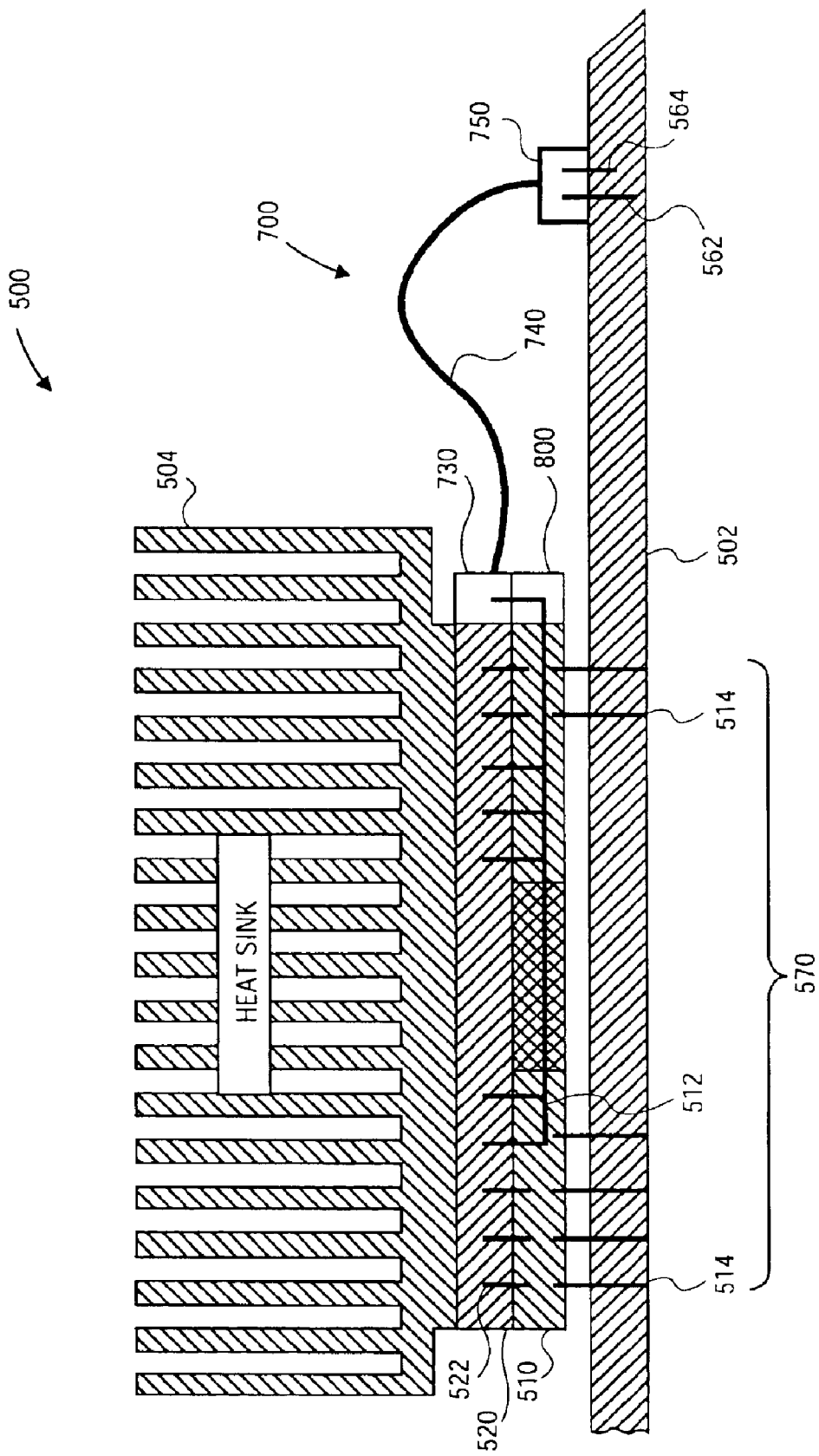
FIG. 5 illustrates an embodiment of an array socket system having a conductor bus, in accordance with the teachings of the present invention.

FIG. 5 illustrates an array socket system 500, according to an embodiment of the present invention. In this embodiment, array socket system 500 includes a circuit board 502, an array socket 510 having a conductor bus 512, a microchip 520 having microchip pins 522, a heat sink 504, a conductor bus interface 800, and a power/ground coupler 700. Power/ground coupler 700 includes an interface adapter 730, a conductor bridge 740, and a power/ground interface 750 electrically coupled to ground reference conductor 562 and power supply conductor 564.

Figure 1:
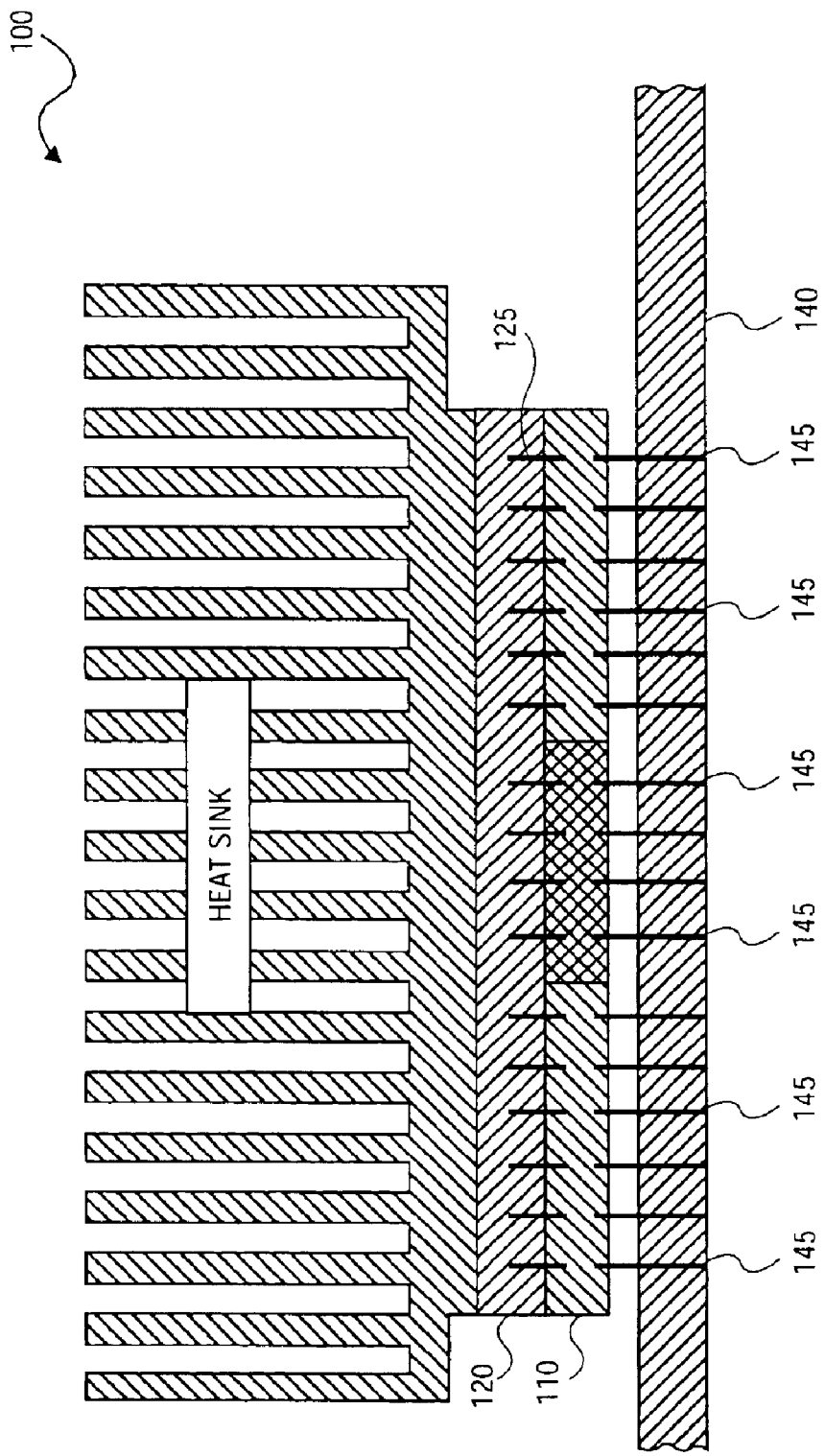
FIG. 1 is a cross-sectional view of a known array socket system.
Figure 2:
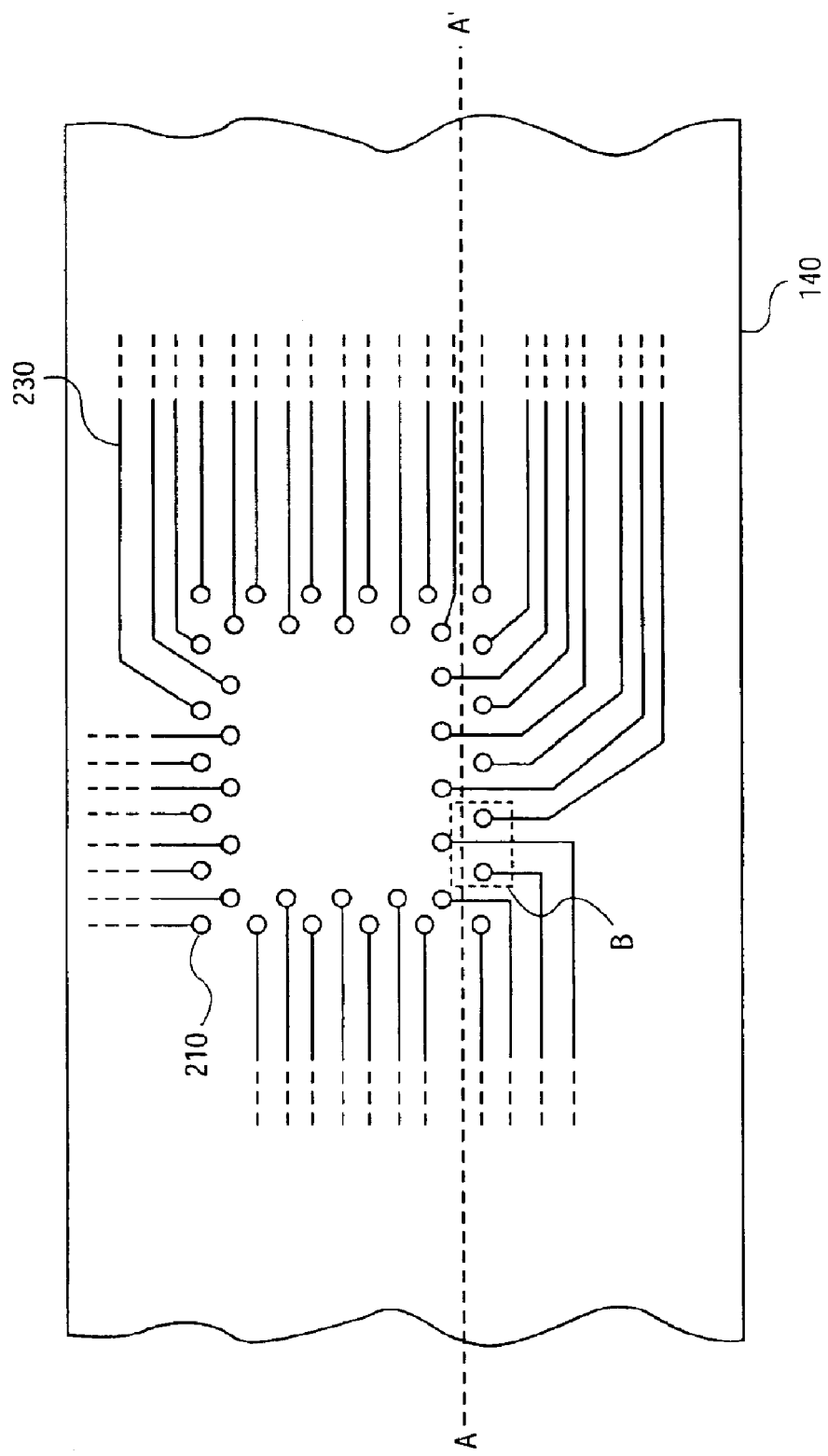
FIG. 2 illustrates an area of a bottom side of a known circuit board, above which an array socket may be mounted.
Figure 3:
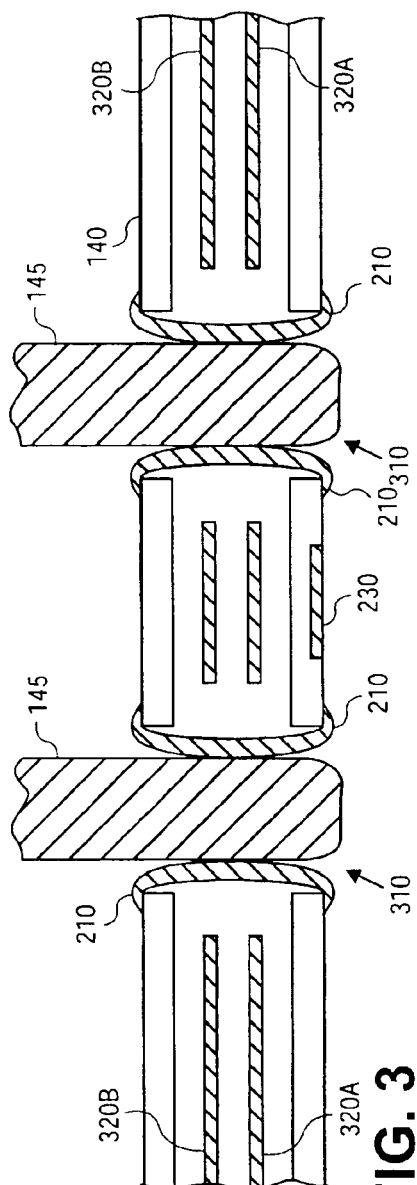
FIG. 3 is a cross-sectional view taken along line A–' of the known circuit board in FIG. 2.
Figure 4:
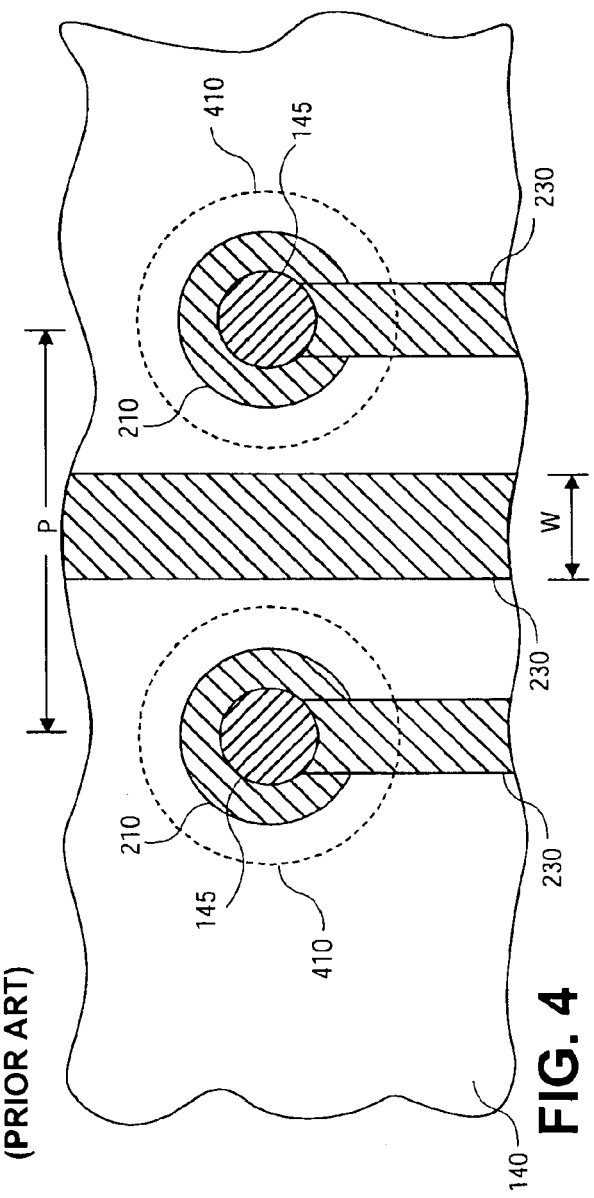
FIG. 4 is an expanded view of an area B of the bottom side of the known circuit board illustrated in FIG. 2.

The elements of array socket system 500 are interconnected as follows. In one embodiment, array socket 510 is mounted on circuit board 502 using socket conductors 514. In some cases, socket conductors 514 may pass through vias (e.g., vias 310) in circuit board 502 to make electrical contact with either internal conducting layers (e.g., ground conductor layer 320A or power conductor layer 320B in FIG. 3) or with conductor traces on a bottom side of circuit board 502. In other cases, socket conductors make electrical contact with conductor traces on a top surface of circuit board 502 (not shown). In one embodiment, socket conductors 514 are pins protruding from a bottom side of array socket 510. In an alternative embodiment, socket conductors 514 represent solder balls for electrically bonding contact pads on a bottom surface of array socket 510 to contact pads on the top surface of circuit board 502 and conductive vias for making electrical contact with the internal conductive layers or conductor traces (e.g., conductor traces 230) on the bottom side of circuit board 502. A region of circuit board 502 where socket conductors 514 penetrate or make contact with circuit board 502 is called a pin field 570 or a ball field 570, depending on whether pins or solder balls are used to make electrical contact.

Figure 6:
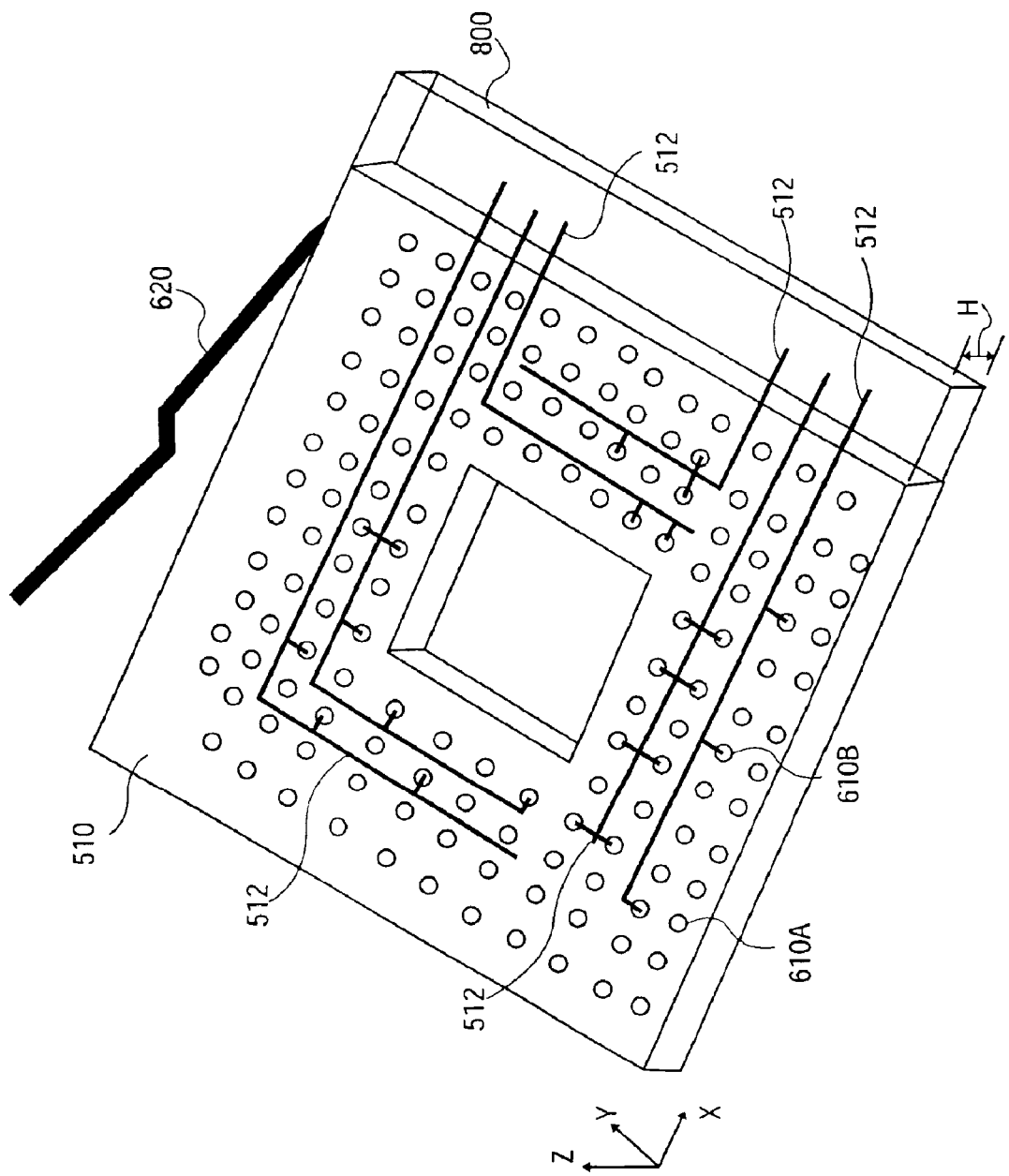
FIG. 6 illustrates a top view of an embodiment of an array socket and a conductor bus interface, in accordance with the teachings of the present invention.

In one embodiment, socket conductors 514 are electrically coupled to pin receptacles 610A (FIG. 6). Pin receptacles 610A and 610B together receive and make electrical contact with microchip pins 522 when microchip 520 is seated in array socket 510, as illustrated. In one embodiment, heat sink 504 is thermally bonded to a top surface of microchip 520 to dissipate excess heat generated during operation of microchip 520. It should be appreciated that heat sink 504 may not be necessary for various types of microchips 520 used in connection with the present invention.

FIG. 6 illustrates a top view of array socket 510 and conductor bus interface 800 without microchip 520 seated thereon, according to an embodiment of the present invention. Conductor buses 512 are electrically coupled within array socket 510 to pin receptacles 610B. Pin receptacles 610A, are those pin receptacles that do not make electrical contact with conductor buses 512. In one embodiment, pin receptacles 610A are electrically coupled to conductor traces on or within circuit board 502 via corresponding socket conductors 514. In one embodiment, pin receptacles 610A deliver I/O signals (e.g., data signals, control signals, addressing signals, and the like) between microchip 520 and various other components mounted on or communicatively coupled to circuit board 502.

Pin receptacles 610B are those pin receptacles that are coupled to one of conductor buses 512. In one embodiment, one or more conductor buses 512 deliver a power supply voltage or a power supply current to microchip 520. In one embodiment, one or more conductor buses 512 deliver a ground reference voltage to microchip 520.

In the illustrated embodiment, conductor buses 512 are housed entirely within array socket 510. In this embodiment, conductor buses 512 run between pin receptacles 610A and 610B. Thus, conductor buses 512 have a width that is less than the pitch of pin receptacles 610A and 610B. However, a thickness of conductor buses 512 along the z-axis may vary depending upon design needs. Generally, it will be desirable to minimize the linear resistance of conductor buses 512. To minimize linear resistance, the thickness of conductor buses 512 may be maximized within array socket 510. Furthermore, the thickness H of array socket 510 may be varied to provide greater z-axis thickness for conductor buses 512.

In one embodiment, one or more conductor buses 512 protrude above and/or below array socket 510. In this case, either array socket 510 is raised above circuit board 502 or an insulating surface is wrapped around the protruding portions of conductor buses 512 so as to prevent an electrical short with conductor traces on the top surface of circuit board 502.

Conductor buses 512 can be made of any conductive material, such as copper. Conductor buses 512 may be formed inside array socket 510 by way of insert molding or other know fabrication techniques.

A locking mechanism 620 is included in the illustrated embodiment of array socket 510. When microchip 522 is seated in array socket 510, microchip pins 520 are inserted into corresponding pin receptacles 610A and 610B. By rotating locking mechanism 620 such that its body is substantially parallel with array socket 510, microchip pins 522 are both mechanically and electrically secured to pin receptacles 610A and 610B. It should be appreciated that various other known methods of locking microchip 520 to array socket 510 fall within the scope of the present invention.

Figure 7:
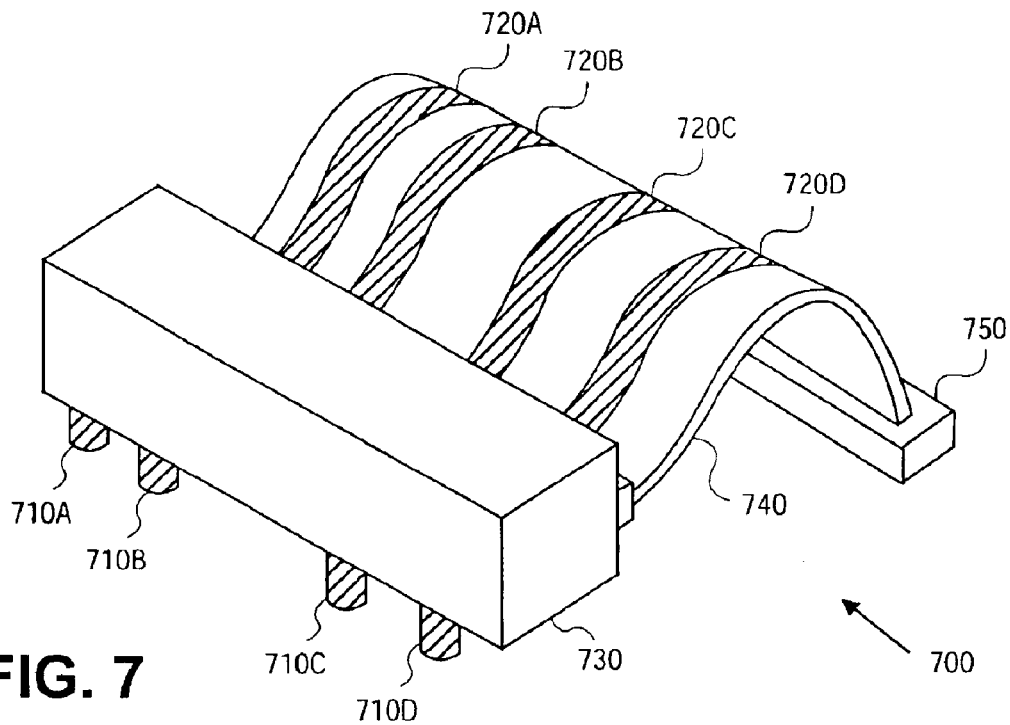
FIG. 7 illustrates an embodiment of a power/ground coupler for coupling to an array socket having conductor buses therein, in accordance with the teachings of the present invention.

Conductor bus interface 800 provides both electrical contact between conductor buses 512 and power/ground coupler 700 and it mechanically attaches one end of power/ground coupler 700 to array socket 510. FIG. 7 illustrates power/ground coupler 700, in accordance with an embodiment of the present invention. This embodiment of power/ground coupler 700 includes an interface adapter 730 having adapter pins 710A, 710B, 710C, and 710D, conductor bridge 740 having conductor lines 720A, 720B, 720C, and 720D, and power/ground interface 750. Adapter pins 710A, 710B, 710C, and 710D are electrically coupled to conductor lines 720A, 720B, 720C, and 720D, respectively. Conductor lines 720A, 720B, 720C, and 720D are each electrically coupled to ground reference conductor 562 and/or power supply conductor 564 via power/ground interface 750. The combinations of couplings between conductor lines 720A, 720B, 720C, and 720D and ground reference conductor 562 and power supply conductor 564 can vary dependent upon power and ground needs of microchip 520.

In one embodiment, conductor bridge 740 is fabricated from ridged materials, such as conductive plastic, printed circuit board having conductor traces thereon, or the like. In one embodiment, conductor bridge 740 is fabricated from flexible materials, such as flex circuit, ribbon cables, or the like. Furthermore, the length of conductor bridge 740 can vary dependent upon the distance between array socket 510 and ground reference conductor 562 and/or power supply conductor 564.

Figure 8:
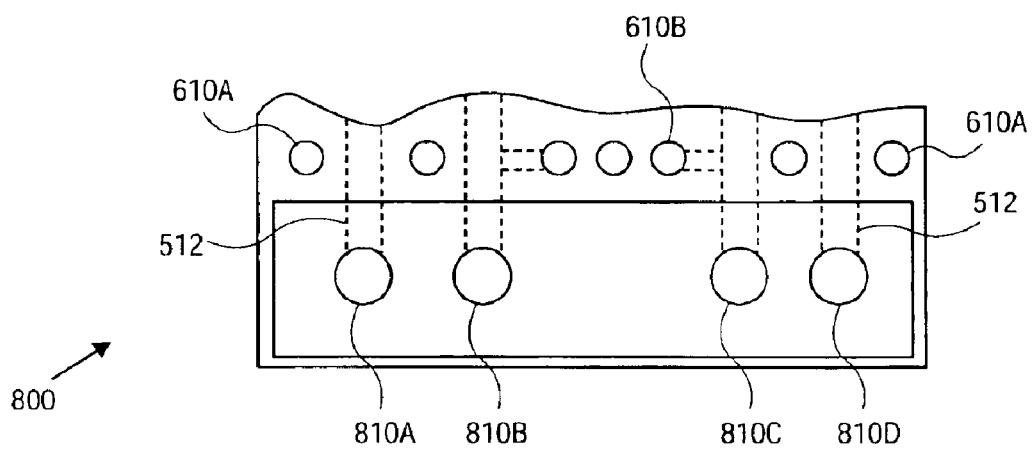
FIG. 8 illustrates an embodiment of a conductor bus interface of an array socket having conductor buses therein, in accordance with the teachings of the present invention.

FIG. 8 illustrates a top view of conductor bus interface 800, in accordance with an embodiment of the present invention. This embodiment includes adapter pin receptacles 810A, 810B, 810C, and 810D. Adapter pin receptacles 810A, 810B, 810C, and 810D are electrically coupled to conductor buses 512. When interface adapter 730 is connected to conductor bus interface 800, adapter pin receptacles 810A, 810B, 810C, and 810D receive and make electrical contact with adapter pins 710A, 710B, 710C, and 710D, respectively. It should be appreciated that although four sets of adapter pins 710A, 710B, 710C, and 710D and adapter pin receptacles 810A, 810B, 810C, and 810D are illustrated in FIGS. 7 and 8, more or less may be utilized in practice. Furthermore, it should be appreciated that the specific structure used to couple interface adapter 730 and conductor bus interface 800 may vary. In fact, in the embodiment illustrated, interface adapter 730 and conductor bus interface 800 form an attachable-detachable connection. In an alternative embodiment, interface adapter 730 and conductor bus interface 800 form a permanent connection.

Figure 9:
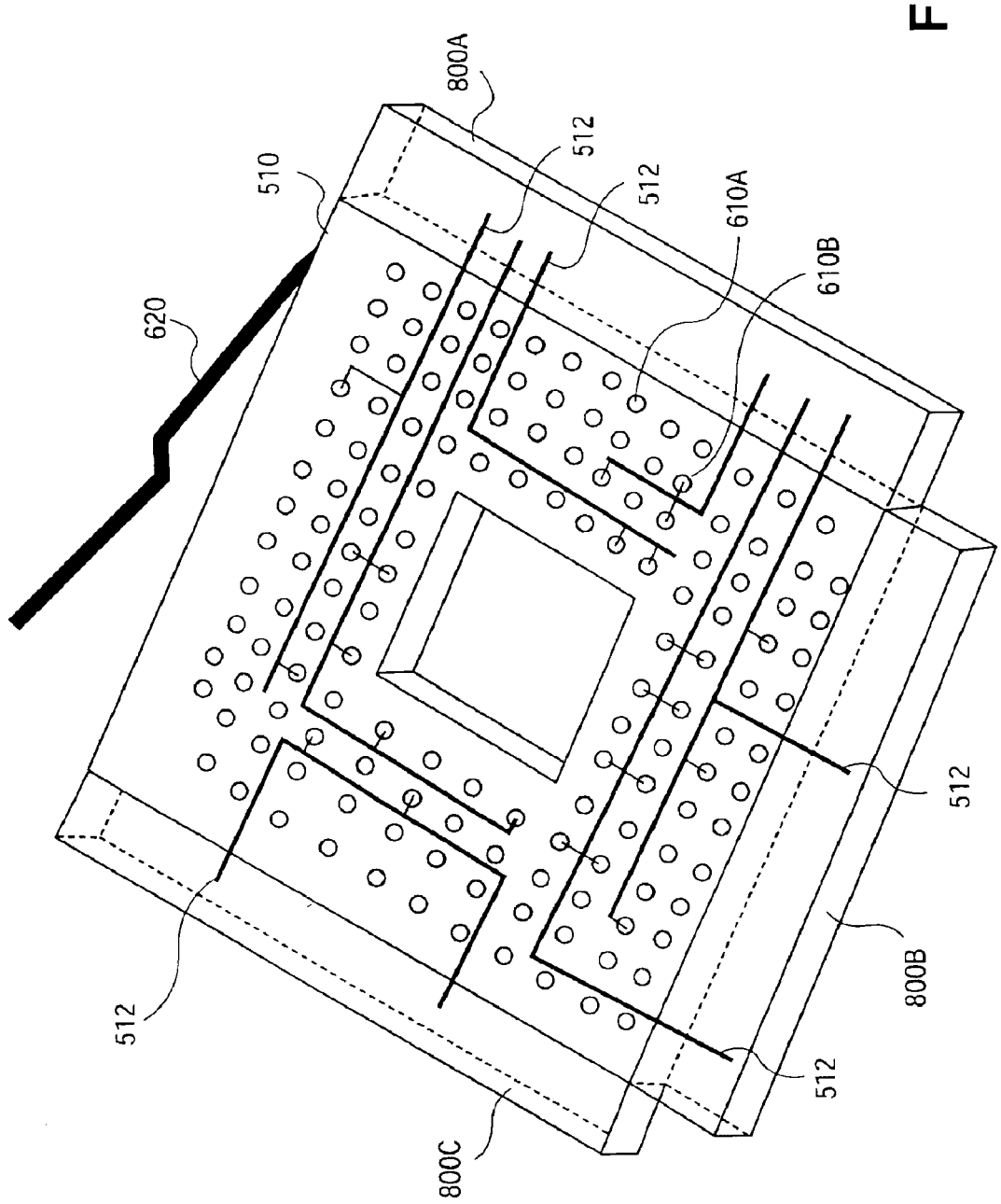
FIG. 9 illustrates an embodiment of an array socket having multiple conductor bus interfaces for connecting to multiple conductor buses, in accordance with the teachings of the present invention.

FIG. 9 illustrates an array socket 510 having three conductor bus interfaces 800A, 800B, and 800C, in accordance with the teachings of the present invention. FIG. 9 illustrates that more than one conductor bus interface 800 can be formed onto array socket 510 to couple to a corresponding number of power/ground couplers 700. Although three are depicted in the illustrated embodiment, two or four may be formed or mounted on array socket 510. If four conductor bus interfaces 800 are implemented, an alternative locking mechanism may be used. Each conductor bus interface 800 may deliver a combination of a power supply voltage and a ground reference voltage or be dedicated to delivering only one of the two. In one embodiment, conductor bus interface 800A delivers a positive power supply voltage, conductor bus interface 800B delivers a ground reference voltage, and conductor bus interface 800C delivers a negative power supply voltage. Furthermore, any number of conductor buses 512 can be coupled to each of conductor bus interfaces 800A, 800B, and 800C as desired.

Using conductor buses 512 to deliver a power supply voltage or a ground reference voltage has several advantages. First, embodiments of array socket system 500 are capable of delivering more current to microchip 520 with fewer resistive losses. By bridging pin field 570 (or ball field 570) conductor lines 720A, 720B, 720C, and 720D are not limited in width based on the I/O package pitch P of microchip 520. Although conductor buses 512 are limited in width by the I/O package pitch P, this limitation can be compensated for by increasing their thickness H.

Second, routing power and ground conductor lines 720A, 720B, 720C, and 720D over (i.e., bridging) pin field 570 (or ball field 570) and the area surrounding array socket 510, as opposed to running power/ground traces along the surface of circuit board 502, decreases conductor trace congestion in this vital area. Reducing trace congestion in this area gives designers of circuit board 502 more flexibility in routing I/O signal traces.

Although the present invention is well suited for delivering power to array socket 510, it should be appreciated that array socket system 500 may be used for other purposes as well. For instances, conductor bus 512 may be coupled to deliver a clock signal throughout microchip 520. Similarly, other I/O signals such as data signals, control signals, and address signals can be communicated to/from microchip 520 via conductor bus 512, conductor bus interface 800 and power/ground coupler 700.

Figure 10:
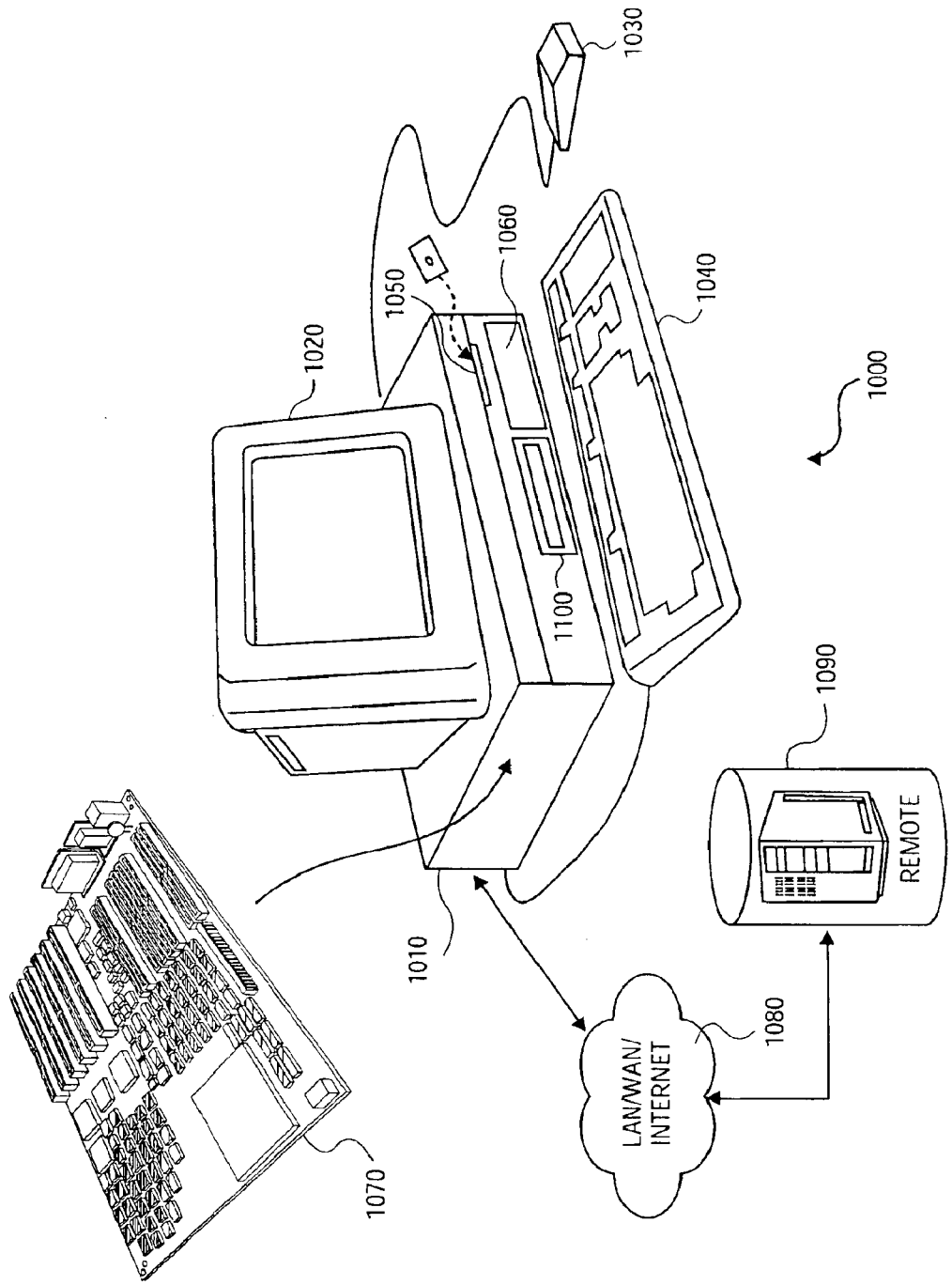
FIG. 10 illustrates a suitable computer system for using embodiments of an array socket having a conductor bus, in accordance with the teachings of the present invention.

FIG. 10 illustrates an embodiment of an exemplary computer system 1000 for using array socket system 500, in accordance with the teachings of the present invention. Computer system 1000 includes a processor chassis 1010, a monitor 1020, a mouse 1030 (or other pointing device), and a keyboard 1040. The illustrated embodiment of chassis 1010 further includes a floppy disk drive 1050, a hard disk 1060, a power supply (not shown), and a motherboard 1070 including array socket system 500. In this embodiment of exemplary computer system 1000, microchip 520 is a central processing unit ("CPU") of computer system 1000, such as the Pentium™ 4 or the like.

Hard disk 1060 may comprise a single unit, or multiple units, and may optionally reside outside of computer system 1000. Monitor 1020 is included for displaying graphics and text generated by software programs and program modules that are run by computer system 1000. Mouse 1030 (or other pointing device) may be connected to a serial port, USB port, or other like bus port communicatively coupled to the CPU. Keyboard 1040 is communicatively coupled to motherboard 1070 in a similar manner as mouse 1030 for user entry of text and commands. In one embodiment, computer system 1000 also includes a NIC (not shown) for connecting computer system 1000 to a computer network 1080, such as a local area network, wide area network, or the Internet. In one embodiment network 1080 is further coupled to a remote computer 1090, such that computer system 1000 and remote computer 1090 can communicate.

Computer system 1000 may also optionally include a compact disk-read only memory ("CD-ROM") drive 1100 into which a CD-ROM disk may be inserted so that executable files and data on the disk can be read or transfer to motherboard 1070 and/or hard disk 1060. Other mass memory storage devices may be included in computer system 1000.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
placing a first conductor bus within an array socket for receiving a microchip;
inserting pin receptacles through a top surface of the array socket to receive microchip pins of the microchip, the first conductor bus being a conductive strip running between adjacent pin receptacles;

electrically coupling the first conductor bus to a first portion of the pin receptacles; and electrically coupling socket conductors to a second portion of the pin receptacles, the socket conductors positioned to couple to conductor traces of a circuit board positioned below the array socket, the first conductor bus to electrically couple the first portion of the pin receptacles to the circuit board outside of the array socket to reduce a number of the conductor traces positioned below the array socket to less than a number of the pin receptacles.

2. The method of claim 1 wherein the first conductor bus is oriented within the array socket to run substantially parallel to the top surface of the array socket.

3. The method of claim 1, further comprising:

mounting the array socket to a circuit board; and electrically coupling the first conductor bus to a signal via a conductor bridge to bridge an area of the circuit board surrounding the array socket.

4. The method of claim 1, further comprising mounting the array socket to the circuit board.

5. The method of claim 4, further comprising bridging an area of the circuit board surrounding the array socket with a first power/ground coupler to electrically couple the first conductor bus to one of a power supply and a ground reference located outside the area of the circuit board surrounding the array socket.

6. The method of claim 5, further comprising forming a first conductor bus interface on the array socket, the first conductor bus interface to receive and to hold a first end of the first power/ground coupler.

7. The method of claim 6 wherein the first power/ground coupler, comprises:

a first interface adapter at the first end to couple to the first conductor bus interface of the array socket;

a first conductor bridge coupled to the first interface adapter for bridging the area of the circuit board surrounding the array socket; and a first power/ground interface at a second end of the first power/ground coupler to electrically couple the first power/ground coupler to one of the power supply and the ground reference.

8. The method of claim 6, further comprising:

placing a second conductor bus within the array socket; and electrically coupling the second conductor bus to a second portion of the pin receptacles.

9. The method of claim 8, further comprising electrically coupling the second conductor bus to an opposite one of the power supply and the ground reference via the first power/ground coupler.

10. The method of claim 8, further comprising bridging the area of the circuit board surrounding the array socket with a second power/ground coupler to electrically couple the second conductor bus to an opposite one of the power supply and the ground reference located outside the area of the circuit board surrounding the array socket.

11. The method of claim 10, further comprising forming a second conductor bus interface on the array socket, the second conductor bus interface to receive and to hold a first end of the second power/ground coupler and wherein the second power/ground coupler, comprises:

a second interface adapter at the first end of the second power/ground coupler to couple to the second conductor bus interface of the array socket;

a second conductor bridge coupled to the second interface adapter for bridging the area of the circuit board surrounding the array socket; and a second power/ground interface at a second end of the second power/ground coupler to electrically couple the power/ground coupler to the opposite one of the power supply and the ground reference.

12. An apparatus, comprising:

a top surface of an array socket to receive a microchip;

a bottom surface of the array socket to mount to a circuit board;

pin receptacles passing through the top surface to receive microchip pins of the microchip; and a first conductor bus residing at least in part between the top surface and the bottom surface of the array socket and electrically coupled to a first portion of the pin receptacles, the first conductor bus being a conductive strip running between adjacent pin receptacles, the conductive strip running between the adjacent pin receptacles coupled to provide at least one of a ground path and a power path to the first portion of the pin receptacles.

13. The apparatus of claim 12 wherein the first conductor bus is oriented to run substantially parallel to the top surface.

14. The apparatus of claim 12, further comprising a first conductor bus interface electrically coupled to the first conductor bus.

15. The apparatus of claim 1, further comprising a second conductor bus residing at least in part between the top surface and the bottom surface and electrically coupled to a third plurality of the plurality of pin receptacles and wherein the first conductor bus and the second conductor bus are oriented to run substantially parallel to the top surface.

16. The apparatus of claim 12, further comprising socket conductors electrically coupled to a second portion of the pin receptacles not coupled to the first conductor bus, the socket conductors positioned to couple to the circuit board, wherein a number of the socket conductors is less than a number of the pin receptacles.

17. The apparatus of claim 14, further comprising the circuit board having one of a pin field and a ball field electrically coupled to a second portion of the pin receptacles.

18. The apparatus of claim 17, further comprising a first power/ground coupler having a first end connected to the first conductor bus interface to make electrical contact with the first conductor bus and a second end electrically coupled to one of a power supply conductor and a ground reference conductor located outside of the one of the pin field and the ball field, the first power/ground coupler bridging the one of the pin field and the ball field.

19. The apparatus of claim 18, further comprising a second conductor bus residing at least in part between the top surface and the bottom surface and electrically coupled to a third portion of the pin receptacles.

20. The apparatus of claim 19, wherein the first conductor bus interface is electrically coupled to the second conductor bus, the first power/ground coupler is electrically coupled to an opposite one of the power supply conductor and the ground reference conductor, and the second conductor bus is electrically coupled to the opposite one of the power supply conductor and the ground reference conductor via the first conductor bus interface and the first power/ground coupler.

21. The apparatus of claim 14, further comprising a second conductor bus interface electrically coupled to the second conductor bus.

22. The apparatus of claim 21, further comprising a second power/ground coupler having a first end connected to the second conductor bus interface to make electrical contact with the second conductor bus and a second end electrically coupled to one of the power supply conductor and the ground reference conductor, the second power/ground coupler bridging the one of the pin field and the ball field.

23. A system, comprising:
- a circuit board having one of a pin field and a ball field thereon;
- an array socket to receive a microchip, the array socket mounted to the circuit board and having pin receptacles to receive microchip pins of the microchip, a first portion of the pin receptacles electrically coupled to the one of the pin field and the ball field; and
- a first power/ground conductor at least in part within the array socket and electrically coupled to a second portion of the pin receptacles, the first power/ground conductor to electrically couple the second portion of the pin receptacles to the circuit board outside of the one of the pin field and the ball field to reduce a number of conductor traces within the one of the pin field and the ball field to less than a number of the microchip pins.

24. The system of claim 23 electrically coupling the first power/ground conductor to a signal via a conductor bridge to bridge an area of the circuit board surrounding the array socket.

25. The system of claim 23 wherein the first power/ground conductor comprises a conductive strip running between adjacent pins receptacles.

26. The system of claim 23, further comprising:
- a first power/ground coupler bridging the one of the pin field and the ball field of the circuit board and electrically coupling the first power/ground conductor to one of a power supply conductor and a ground reference conductor; and
- a first power/ground conductor interface on the array socket to receive the first power/ground coupler.

27. The system of claim 26, further comprising a second power/ground conductor at least in part within the array socket and electrically coupled to a third portion of the pin receptacles.

28. The system of claim 27, wherein the second power/ground conductor is electrically coupled to an opposite one of the power supply conductor and the ground reference conductor via the first power/ground coupler.

29. The system of claim 27, further comprising:
- a second power/ground coupler bridging the one of the pin field and the ball field of the circuit board and electrically coupling the second power/ground conductor to an opposite one of the power supply conductor and the ground reference conductor; and
- a second power/ground conductor interface on the array socket to receive the second power/ground coupler.

30. The system of claim 27, further comprising:
- a third power/ground conductor at least in part within the array socket coupled to a fourth portion of the pin receptacles;
- a third power/ground coupler bridging the one of the pin field and the ball field of the circuit board and electrically coupling the third power/ground conductor to one of a second power supply conductor and the ground reference conductor; and
- a third power/ground conductor interface on the array socket to receive the third power/ground coupler.

* * * * *

UNITED STATES PATENT AND TRADEMARK OFFICE
CERTIFICATE OF CORRECTION

PATENT NO. : 6,916,183 B2
DATED : July 12, 2005
INVENTOR(S) : Alger et al.

It is certified that error appears in the above-identified patent and that said Letters Patent is hereby corrected as shown below:

Column 2,
Line 25, delete "A-'" and insert -- A-A' --.

Column 8,
Line 25, delete "1" and insert -- 12 --.

Signed and Sealed this

Sixth Day of September, 2005

JON W. DUDAS
*Director of the United States Patent and Trademark Office*